United States Patent Office 3,028,239
Patented Apr. 3, 1962

3,028,239

LIGHT SENSITIVE ELEMENTS FOR THE PRODUCTION OF LITHOGRAPHIC PRINTING PLATES

Wilhelm Neugebauer and Martha Tomanek, Wiesbaden-Biebrich, Germany, assignors, by mesne assignments, to Azoplate Corporation, Murray Hill, N.J., a corporation of New Jersey No Drawing. Filed Apr. 1, 1955, Ser. No. 498,779
Claims priority application Germany Apr. 3, 1954
21 Claims. (Cl. 96—86)

This invention relates to lithographic printing plates and light sensitive coatings therefor. More particularly, the invention is concerned with pre-sensitized printing foils and with the sensitizers used thereon.

For a long time photo-mechanical printing plates for flat bed and offset printing have been produced by coating a suitable support, e.g. a metal plate or foil, such as aluminum or zinc, paper foils, cellulose acetate foils, etc., with a light hardenable colloidal substance, e.g. gelatine, fishglue, etc., containing a light-sensitive substance. The printing plate is produced in this process by exposing the light-sensitive layer to an original (containing the image to be reproduced) and the resultant image is then finished by development of the layer. It is possible to produce both positive and negative printing plates from a positive original by this method. More recently the practice has been to produce the light-sensitive layers without using a colloidal substance by coating the foil with a solution of a light-sensitive substance itself. If the light-sensitive substance is insoluble in water, organic solvents may be used to prepare the solution. The coating is subsequently dried. An image is then transferred to the plate by exposing the light sensitive layer to light through a transparent original. Thereafter, by treatment with a suitable developer agent, all those areas which are not to accept ink (hereinafter referred to as non-imaged areas) are removed, leaving only those areas of the exposed layers which are to accept greasy ink in the printing process (hereinafter referred to as the imaged areas). The imaged areas may be either those areas struck by light (in which case a printing plate with a positive image and positive prints may be obtained from a negative master) or the imaged areas may be those areas not struck by light (in which case a printing plate may give a positive image from a positive original). The undesired areas of the originally light sensitive layer are removed (i.e. development of the image) by treating the layer with dilute alkaline or dilute acid solutions or also with organic solvents, depending upon the difference in solubility between those areas to be removed and those areas which remain. Generally, the development is followed by washing with water, treating with dilute acid, and finally applying the greasy ink.

An object of the invention is the provision of a novel light sensitive material usable for the production of lithographic printing plates. A further object is the production of presensitized printing foils which are capable of being stored for long periods of time prior to being used while still retaining their light sensitivity. A still further object of the invention is the provision of a lithographic printing plate capable of long runs. Other objects and advantages will be readily apparent from a reading of the description hereinafter following.

The present invention is concerned with a process for the photomechanical production of printing plates of the latter type described, in which process a sheet-like material consisting of a support coated with a colloid-free light-sensitive layer is exposed under an original and then developed. We have now found that printing plates are advantageously obtained by such process by coating an aluminum foil with a light-sensitive layer consisting of 9-methylene-fluorene-2-sulfonic acid-aryl-amides, in which the methylene group is substituted by aryl, aralkyl, aralkylene or heterocyclic residues, then drying the applied layer, exposing the layer under an original, treating the exposed layer with dilute alkaline solution to which organic solvents may be added, rinsing the developed layer with water and then wiping the layer over with dilute acid and greasy ink, either simultaneously or successively.

The derivatives of the 9-methylene-fluorene or di-benzofulvene used to prepare the light-sensitive layer of the sheet material to be transformed into printing plates, according to the present invention correspond to the following general formula:

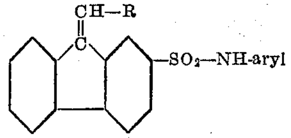

wherein: R stands for aryl, aralkyl, aralkylene, or a heterocyclic residue. We understand the terms "aryl," "aralkyl," "aralkylene" and "heterocyclic" to include within their scope substituted as well as unsubstituted "aryl," "aralkyl," "aralkylene," and "heterocyclic" residues, respectively. These derivatives are prepared by condensing the corresponding fluorene-2-sulfonic acid-aryl-amides with an aromatic aldehyde, such as benzaldehyde, benzaldehydes which are ring substituted, terephthalaldehyde, or with an araliphatic aldehyde with saturated or unsaturated chains, e.g. cinnamaldehyde, or with heterocyclic aldehydes, e.g. pyridine aldehyde, or furfuraldehyde.

The condensation of fluorene substances with aldehydes, to form fulvene compounds, has already been described; cf. "Berichte der Deutschen Chemischen Gesellschaft," vol. 52 (1919), pages 1513–1517, and vol. 54 (1921), pages 2072–2078. Furthermore, it is also known that 9-methylenefluorene polymerises under the influence of light, cf. "Berichte der Deutschen Chemischen Gesellschaft," vol. 55 (1922), page 3317. However, these facts gave no indication that the derivatives of the 9-methylene-fluorene-2-sulfonic acid aryl amides to be used according to the present invention are light-sensitive substances, which as a layer on an aluminum surface may be photomechanically converted into durable surfaces which are receptive to printing ink, and thus sensitized can be used for making prnting plates.

The following compounds are given only as examples of 9-methylene-2-sulfonic acid aryl-amides to be used according to the present invention for the preparation of a light-sensitive layer.

(1) 2 - sulfanilido-9-(4′-nitro-benzal)-fluorene (melt. point 228–232°). Prepared by boiling for 10 hours an alcoholic solution of 2-sulfanilido-fluorene with 4-nitrobenzaldehyde in the presence of sodium ethylate.

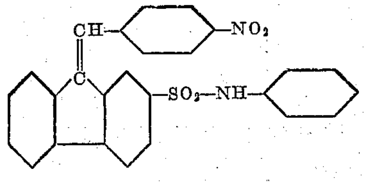

(2) 2 - sulfanilido-9-piperonylidene-fluorene (melting point 166–168° C.). Prepared by condensing 2-sulfanilidofluorene with piperonal.

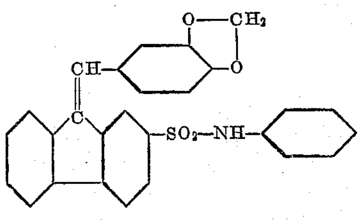

(3) 2 - sulfanilido-9-pyridinylidene-fluorene (melting point 205° C.). Prepared by condensing 2-sulfanilidofluorene with 2-pyridine-aldehyde.

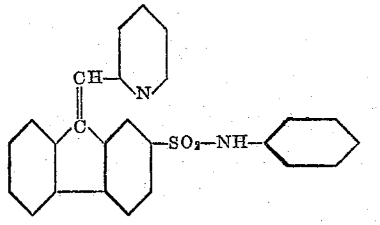

(4) 2 - sulfo-α-naphthylamido-9-(4′-methoxy-benzal)-fluorene (melting point 223–224° C.). Prepared by condensing 2-sulfo-α-naphthylamido-fluorene an anis-aldehyde.

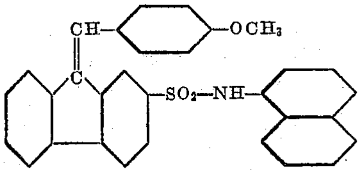

(5) 2 - sulfanilido-9-cinnamylidene-fluorene (melting point 241–242° C.). Prepared by condensing 2-sulfanilido-fluorene and cinnamaldehyde.

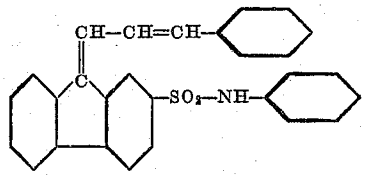

(6) 2 - sulfanilido - 9-(4′-methoxy-benzal)-fluorene (melting point 295° C.). Prepared by condensing 2-sulfanilido-fluorene and anisaldehyde.

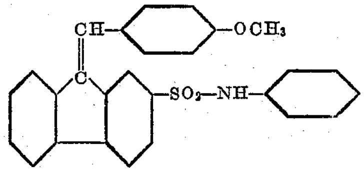

(7) 2 - sulfanilido-9-furfural-fluorene (melting point 150–152° C.). Prepared by condensing 2-sulfanilidofluorene with furfuraldehyde.

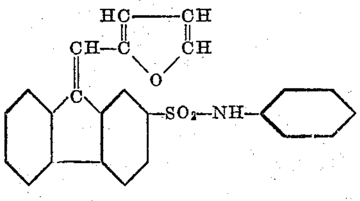

(8) Terephthalal-2,2′-disulfanilido-di-fluorene (melting point 250° C.). Prepared by condensing 2-sulfanilidofluorene with terephthal-aldehyde.

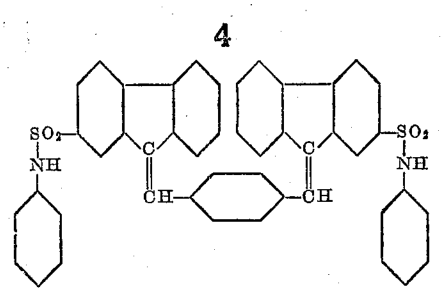

The light-sensitive material from which printing plates are intended to be produced is preferably prepared by coating an aluminum foil (which may be chemically or electro-chemically oxidized) with solutions of the 9-methylene-fluorene-2-sulfonic acid aryl amide derivatives of the present invention. The solutions are coated on the base material by using one of the methods well-known in the art, e.g. by means of a plate whirler, and the layer is then dried. For the preparation of the coating solutions, organic solvents, such as alcohol, dioxane, monomethyl glycol ether, pyridine and benzene are used, or a mixture of such solvents.

The di-benzo-fulvene substances of the present invention may also be applied in a mixture with each other. This is of particular advantage if the individual compounds show a tendency to crystallize. By using a mixture of several di-benzo-fulvene compounds, a smooth layer, which is free of undesired crystallization effects, is produced on the support.

In order to produce a printing plate from the light-sensitive material thus obtained, the latter is exposed under a transparent original. Exposure may be carried out, for example, by menas of an arc lamp or a mercury vapor lamp.

Most of the compounds of the instant invention are negative working. The images obtained are clearly visible, whereas the areas struck by light are bleached out. We believe that the explanation for this is that most probably dimer compounds are formed.

For example:

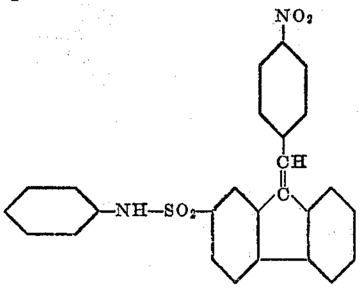

upon exposure to light becomes:

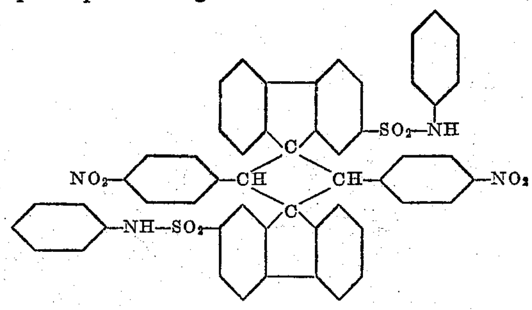

The exposed layer is then treated with dilute alkaline solutions, e.g. of caustic soda, sodium carbonate, trisodium phosphate, or a mixture of trisodium phosphate and disodium-phosphate, with or without the addition of organic solvents, such as ethyl alcohol, methyl alcohol, acetone, methyl-ethyl-ketone, or monomethyl-glycol ether. Then it is rinsed with water and either simultaneously or successively swabbed with dilute acid, preferably phosphoric acid, and with greasy ink. The inking operation may be effected mechanically in the printing apparatus.

The printing plates prepared according to the present invention are capable of being used for long runs. A special advantage of the light-sensitive material of the present invention is its stability in the unexposed state, which allows for long storage even under unfavorable climatic conditions. Even after 21 days in a sweat box the presensitized plates remain unchanged.

The following examples are given to further illustrate the light sensitive material of the invention and are not intended as being limitative of the scope thereof.

*Example 1*

A solution containing 1 part by weight of 2-sulfanilido-9-(4'-nitro-benzal)-fluorene (Formula 1) in 100 parts by volume of monomethyl glycol ether is coated onto a superficially roughened aluminum foil, for instance by means of a platewhirler. The foil is then dried. After drying, the coated side of the foil is exposed under a negative original for 5 minutes to the light emitted from an 18 amp. arc lamp at a distance of 60 cm. The exposed foil is then wiped over with a 3% trisodium phosphate solution, rinsed well with water and swabbed with a 3% phosphoric acid solution and rubbed in with greasy ink. There appears on the foil a reversed image of the original, i.e. a positive from the negative used, and it may be used for printing in an offset printing machine. Long runs are possible.

*Example 2*

An anodically oxidized aluminum foil is coated with a solution containing 1.5 parts by weight of 2-sulfo-α-naphthyl-amido-9-(4'-methoxy-benzal)-fluorene (Formula 4) dissolved in 100 parts by volume of a 1:1 mixture of dioxane and ethyl alcohol. The foil is then dried and exposed under a negative pattern. The exposed foil is rubbed in with a 3% sodium carbonate solution to which 1% of monomethyl glycol ether has been added, rinsed with water and rubbed in with greasy ink and a 2% phosphoric acid. The foil shows a positive image of the pattern and may be used as a positive printing plate.

In the unexposed state, the shelf-life of the 2-sulfo-α-naphthylamido-9-(4'-methoxy-benzal)-fluorene layer thus produced on the aluminum foil is practically unlimited.

*Example 3*

An aluminum foil is coated according to the method described in Example 1, but the light-sensitive layer is produced by means of a solution containing 1 part by weight of a 1:1 mixture of 2-sulfanilido-9-(4'-methoxy-benzal)-fluorene (Formula 6) and 2-sulfanilido-9-cinnamylidene-fluorene (Formula 5) dissolved in 100 parts by volume of dioxane. After drying, the light-sensitive foil is further treated as in Example 1, which leads to a positive image if a negative pattern was used. The foil may then be used as a printing plate.

*Example 4*

0.5 part by weight of terrephthalal-2,2'-disulfanilido-difluorene (Formula 8) are dissolved in 100 parts by volume of monomethyl glycol ether. An aluminum plate is coated with this solution and dried. The plate thus coated is then exposed to light under a negative pattern, treated first with xylene and then with a 3% trisodium-phosphate solution, rinsed with water and finally rubbed in with greasy ink and dilute phosphoric acid. From a negative pattern a reverse image, i.e. a positive image, is obtained which may be used as a positive printing plate.

Example *5*

A 1% solution of 2-sulfanilido-9-piperonylidene-fluorene (Formula 2), in 100 parts by vol. of ethyl alcohol, is used for coating a superficially roughened aluminum foil. Further treatment of the foil is as described in Example 1 with the exception that the exposed layer is swabbed with a 0.5% caustic soda solution. A positive printing plate is obtained from a negative master.

Example *6*

A 1% solution of 2-sulfanilido-9-furfural-fluorene (Formula 7), in dioxane, is used for coating a superficially roughened aluminum foil. The further treatment of the foil is as in Example 1. From a negative master a positive image and consequently a positive printing plate is obtained.

*Example 7*

A 1% solution of 2-sulfanilido-9-α-pyridinylidene-fluorene (Formula 3) in 100 parts by volume of methyl alcohol is used for coating a superficially roughened aluminum foil. The further treatment of the foil is as described in Example 1, with the exception that the exposed layer is swabbed with a 1:1 mixture of a 3% disodium phosphate solution and a 3% trisodium phosphate solution. A positive printing plate is obtained from a negative master.

What we claim is:

1. Light sensitive material for the production of lithographic printing plates comprising a base having a thin and uniform light sensitive coating thereon, said coating consisting essentially of

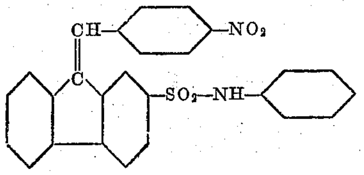

2. Light sensitive material for the production of lithographic printing plates comprising a base having a thin and uniform light sensitive coating thereon, said coating consisting essentially of

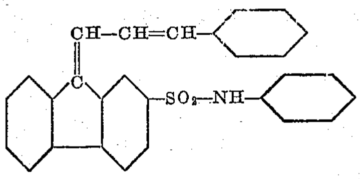

3. Light sensitive material for the production of lithographic printing plates comprising a base having a thin and uniform light sensitive coating thereon, said coating consisting essentially of

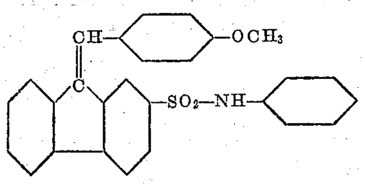

4. Light sensitive material for the production of lithographic printing plates comprising a base having a thin and uniform light sensitive coating thereon, said coating consisting essentially of

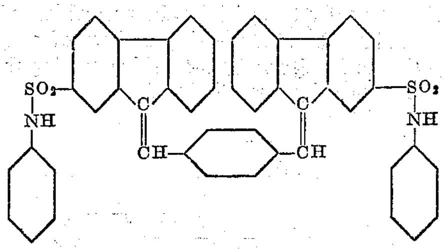

5. Light sensitive material for the production of lithographic printing plates comprising a base having a thin and uniform light sensitive coating thereon, said coating consisting essentially of

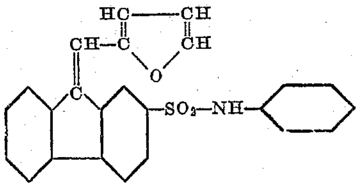

6. Light sensitive material for the production of lithographic printing plates comprising a sheet of aluminum having a thin and uniform light sensitive coating thereon, said coating consisting essentially of

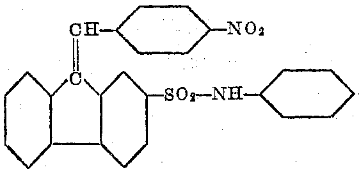

7. Light sensitive material for the production of lithographic printing plates comprising a sheet of aluminum having a thin and uniform light sensitive coating thereon, said coating consisting essentially of

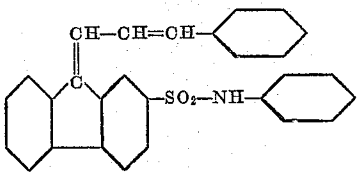

8. Light sensitive material for the production of lithographic printing plates comprising a sheet of aluminum having a thin and uniform light sensitive coating thereon, said coating consisting essentially of

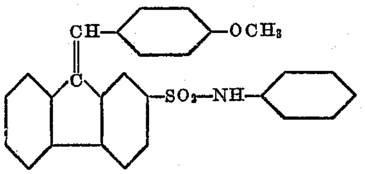

9. Light sensitive material for the production of lithographic printing plates comprising a sheet of aluminum having a thin and uniform light sensitive coating thereon, said coating consisting essentially of

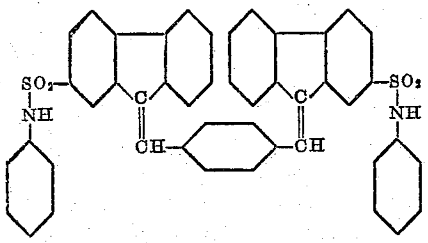

10. Light sensitive material for the production of lithographic printing plates comprising a sheet of aluminum having a thin and uniform light-sensitive coating thereon, said coating consisting essentially of

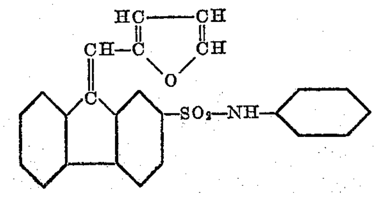

11. The light sensitive compound

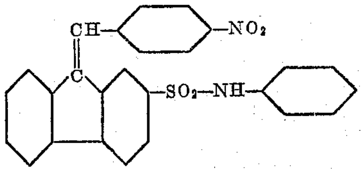

12. The light sensitive compound

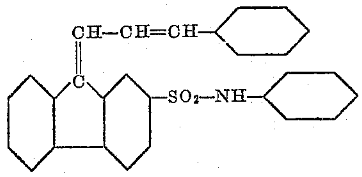

13. The light sensitive compound

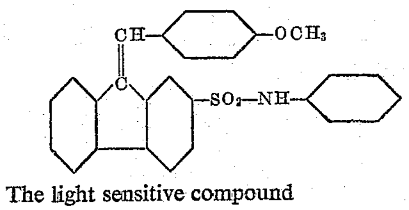

14. The light sensitive compound

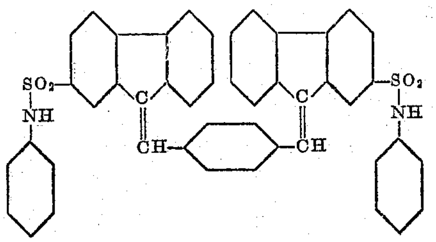

15. The light sensitive compound

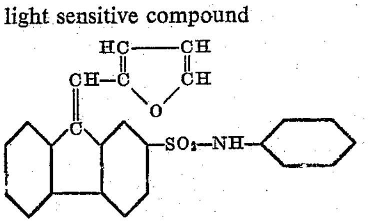

16. A compound having the formula

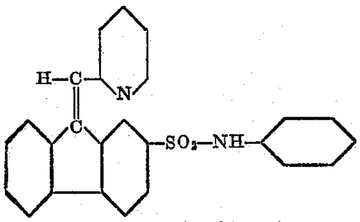

17. A compound having the formula

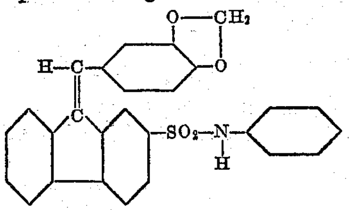

18. A compound having the formula

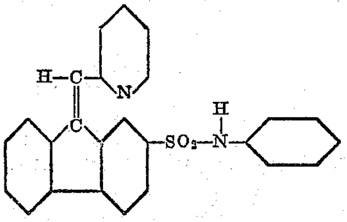

19. A method of making a presensitized printing plate which comprises coating a base material with a layer consisting essentially of a compound having the formula

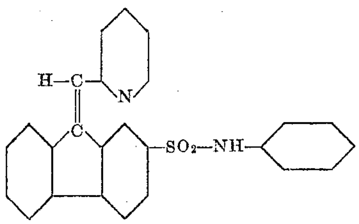

20. A method of making a presensitized printing plate which comprises coating a base material with a layer consisting essentially of a compound having the formula

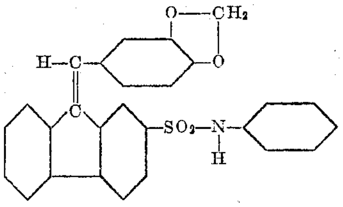

21. A method of making a presensitized printing plate which comprises coating a base material with a layer consisting essentially of a compound having the formula

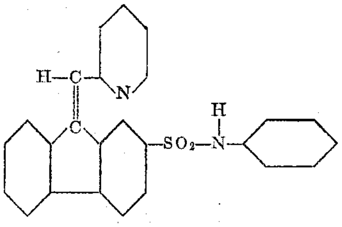

References Cited in the file of this patent

UNITED STATES PATENTS

| | | |
|---|---|---|
| 2,673,220 | Hunter | Mar. 23, 1954 |
| 2,680,135 | Gregory | June 1, 1954 |
| 2,696,435 | Neugebauer et al. | Dec. 7, 1954 |
| 2,702,243 | Schmidt | Feb. 15, 1955 |

OTHER REFERENCES

Handbook of Chemistry and Physics, 30th Edition, 1947, Chemical Rubber Publishing Company, Cleveland, pp. 572 and 573.